(12) United States Patent
Smith et al.

(10) Patent No.: US 10,096,991 B2
(45) Date of Patent: Oct. 9, 2018

(54) NETWORK PROTECTOR CONTROL FOR SPOT NETWORK FED FROM FEEDER SOURCES HAVING VOLTAGE DIFFERENCES

(71) Applicant: COOPER TECHNOLOGIES COMPANY, Houston, TX (US)

(72) Inventors: David R. Smith, Mckeesport, PA (US); Marc Andre Faulkner, Greenwood, SC (US)

(73) Assignee: EATON INTELLIGENT POWER LIMITED, Dublin 4 (IE)

( * ) Notice: Subject to any disclaimer, the term of this patent is extended or adjusted under 35 U.S.C. 154(b) by 295 days.

(21) Appl. No.: 15/180,638

(22) Filed: Jun. 13, 2016

(65) Prior Publication Data

US 2017/0358919 A1    Dec. 14, 2017

(51) Int. Cl.
| | |
|---|---|
| H02H 3/00 | (2006.01) |
| H02H 3/26 | (2006.01) |
| H02H 1/00 | (2006.01) |
| H02H 1/06 | (2006.01) |
| H02H 3/30 | (2006.01) |
| G01R 31/08 | (2006.01) |
| H02H 3/38 | (2006.01) |

(52) U.S. Cl.
CPC .......... *H02H 3/26* (2013.01); *H02H 1/0007* (2013.01); *H02H 1/06* (2013.01); *G01R 31/086* (2013.01); *H02H 3/302* (2013.01); *H02H 3/382* (2013.01); *H02H 3/387* (2013.01)

(58) Field of Classification Search
USPC .................................................. 361/62–69
See application file for complete search history.

(56) References Cited

U.S. PATENT DOCUMENTS

| | | | |
|---|---|---|---|
| 2,020,931 A | 11/1935 | Bostwick et al. | |
| 3,453,495 A * | 7/1969 | Thomas | H02H 3/003 307/51 |
| 3,947,728 A | 3/1976 | Smith | |
| 4,293,886 A * | 10/1981 | Church | H02H 3/387 361/62 |
| 5,822,165 A | 10/1998 | Moran | |
| 5,844,781 A | 12/1998 | Schollerer et al. | |
| 6,504,693 B1 | 1/2003 | Moffat et al. | |

FOREIGN PATENT DOCUMENTS

CA            550893 A      12/1957

* cited by examiner

*Primary Examiner* — Danny Nguyen
(74) *Attorney, Agent, or Firm* — Eckert Seamans

(57) ABSTRACT

In one embodiment, a network protector for a spot network includes a circuit breaker and a network protector relay coupled to the circuit breaker. The network protector relay is structured and configured to have network protector relay non-sensitive trip settings for controlling operation of the circuit breaker that will cause the network protector to remain closed when: (i) an angular difference (±) between a transformer phase-to-neutral voltage of the first feeder branch and a transformer phase-to-neutral voltage of the second feeder branch is less than or equal to a first threshold value, and (ii) a magnitude difference (±) between the transformer phase-to-neutral voltage of the feeder branch and the transformer phase-to-neutral voltage of the second feeder branch is less than or equal to a second threshold value.

15 Claims, 4 Drawing Sheets

NETWORK PROTECTOR CONTROL FOR SPOT NETWORK FED FROM FEEDER SOURCES HAVING VOLTAGE DIFFERENCES

BACKGROUND

Field

The disclosed concept pertains generally to spot networks, and, more particularly, to spot networks fed from feeder sources having voltage differences (angle and/or and magnitude).

Background Information

Low voltage secondary power distribution networks consist of interlaced loops or grids supplied by two or more sources of power, in order that the loss of any one source will not result in an interruption of power. Such networks, commonly referred to as low-voltage networks, provide the highest possible level of reliability with conventional power distribution systems and are, normally, used to supply high-density load areas, such as a section of a city, a large building or an industrial site.

Each power source supplying the low-voltage network is typically supplied from a medium voltage feeder, referred to as a network unit, and includes a high-voltage disconnect and grounding switch, a voltage reducing transformer and a network protector. As is well-known, a network protector is an apparatus used to control the flow of electrical power to and from a low-voltage secondary network. The network protector includes a low-voltage circuit breaker and a control relay, referred to as a network relay, which opens the circuit to the transformer upon detection of abnormal current flow. Specifically, the network relay typically senses the network voltages, the line currents and the phasing voltage, and executes algorithms to initiate circuit breaker tripping or re-closing actions. Trip determination is based on detecting reverse power flow in the network protector, that is, power flow from the low-voltage network back to the primary feeder. Examples of network protector relays are disclosed in U.S. Pat. Nos. 3,947,728; 5,822,165; 5,844,781; and 6,504,693, which are incorporated by reference herein.

For redundancy purposes, electrical customers may prefer spot networks that are fed from different substation sources. However, problems, such as network protectors sitting open all of the time and failing to close, or network protector pumping, can arise when spot networks are fed from different sources and those sources have voltage differences (angle and/or and magnitude). Under those conditions where only one of the two protectors in the spot network is closed, momentary outages can occur to the customers supplied from the spot network should the feeder with the closed protector experience a fault.

SUMMARY

In one embodiment, a network protector for a spot network is provided that includes a circuit breaker and a network protector relay coupled to the circuit breaker. The network protector relay is structured and configured to have network protector relay non-sensitive trip settings for controlling operation of the circuit breaker that will cause the network protector to remain closed when: (i) an angular difference (±) between a transformer phase-to-neutral voltage of the first feeder branch and a transformer phase-to-neutral voltage of the second feeder branch is less than or equal to a first threshold value, and (ii) a magnitude difference (±) between the transformer phase-to-neutral voltage of the feeder branch and the transformer phase-to-neutral voltage of the second feeder branch is less than or equal to a second threshold value.

In another embodiment, a method of controlling a network protector for a spot network (2) having a first feeder branch (6A) and a second feeder branch (6B) is provided. The network protector includes a circuit breaker (28) and a network protector relay (26) coupled to the circuit breaker. The method includes controlling operation of the circuit breaker from the network protector relay based on network protector relay non-sensitive trip settings, wherein the controlling includes causing the network protector to remain closed when: (i) an angular difference (±) between a transformer phase-to-neutral voltage of the first feeder branch and a transformer phase-to-neutral voltage of the second feeder branch is less than or equal to a first threshold value, and (ii) a magnitude difference (±) between the transformer phase-to-neutral voltage of the feeder branch and the transformer phase-to-neutral voltage of the second feeder branch is less than or equal to a second threshold value.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
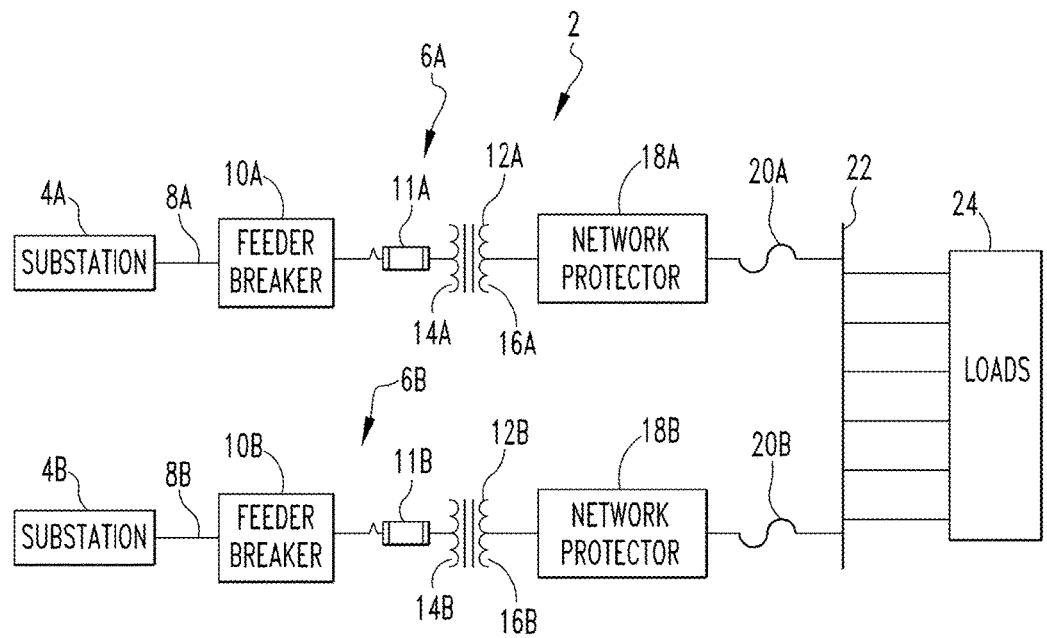
FIG. 1 is a schematic diagram of a two-unit spot network according to an exemplary embodiment of the disclosed concept.

Directional phrases used herein, such as, for example, left, center, right, front, back, top, bottom and derivatives thereof, relate to the orientation of the elements shown in the drawings and are not limiting upon the claims unless expressly recited therein.

As employed herein, the term "number" shall mean one or an integer greater than one (i.e., a plurality).

As employed herein, the statement that two or more parts are "coupled" together shall mean that the parts are joined together either directly or joined through one or more intermediate parts.

As employed herein, the term "spot network" shall mean an electrical distribution system including a set (two or more) of network protectors and transformers which supply power to a specific location or "spot" through a common bus to which the network protectors are connected.

Figure 3:
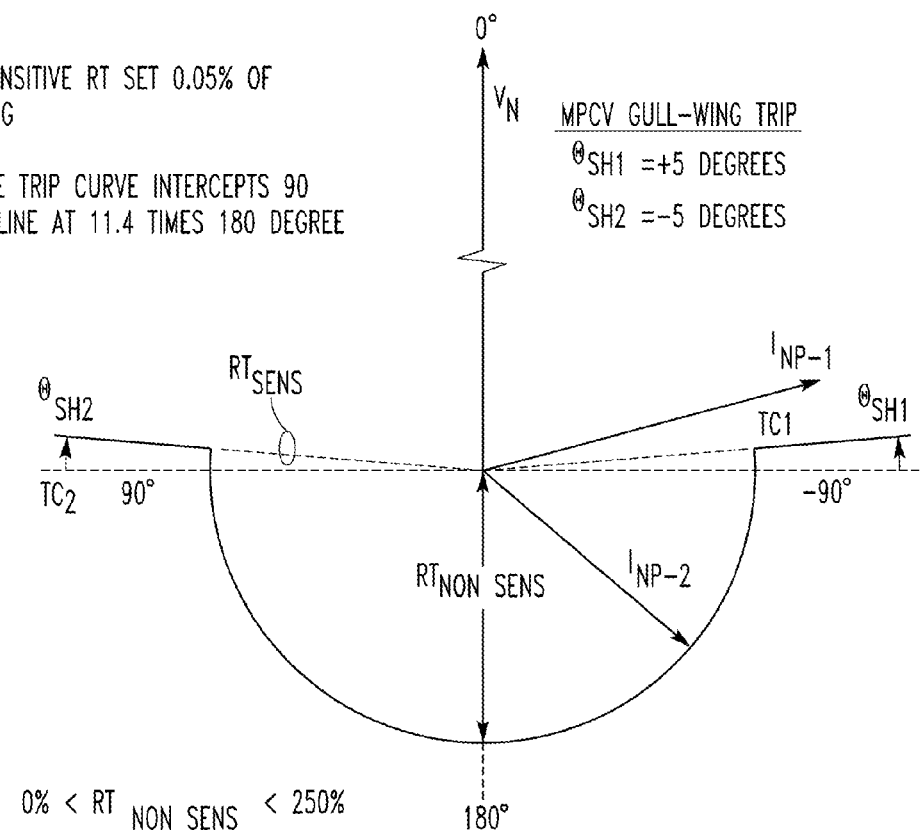
FIG. 3 shows the sensitive trip characteristic and non-sensitive trip characteristics for an exemplary network relay.

As employed herein, the term "network protector relay non-sensitive trip characteristic or setting" shall mean a directional characteristic such as in FIG. 3, that will cause the network protector to trip without time delay when the directional trip characteristic is satisfied, and the current in any one phase of the network protector is above the value defined by the non-sensitive trip characteristic, being the radius of the circle in FIG. 3.

As employed herein, the term "network protector relay sensitive trip setting" shall mean a directional trip characteristic which can be satisfied for currents that are as small as 0.10% or less of the network protector CT rating, which are 180 degrees displaced from the network line-to-ground voltage. The directional characteristic can be that of the gull-wing as shown in FIG. 3, or it may have any shape that allows for detection of high-current backfeeds to multiphase faults on a primary feeder, backfeed to single line-to-ground faults on a primary feeder, or a backfeed when a primary feeder breaker is opened in absence of a fault.

As employed herein, the term "network protector relay close characteristics and settings" shall mean straight-lines or curves of any shape that define for the open network protector where the phasing voltage must lie in order for the network relay to command the network protector to close, where the settings define the position of the close characteristics in relation to the network line-to-ground voltage which serves as the reference phasor for the relay close characteristics. The phasing voltage shall mean a computed voltage which is obtained from appropriate combination of the voltages across each of the three phases of the open network protector.

As employed herein, the term "medium voltage" shall mean a system nominal voltage between 1 kV to 35 kV.

As described in greater detail herein, the disclosed concept provides a methodology for enabling successful operation of a two-unit spot network that is supplied from sources having considerable differences in the magnitude and/or angle of the voltage that is applied to the high voltage terminals of the network transformers of the spot network. More specifically, the disclosed concept provides a methodology for controlling the network protectors in such a spot network that overcomes the problems of such systems in the prior art.

FIG. 1 is a schematic diagram of a spot network 2 according to an exemplary embodiment of the disclosed concept. Spot network 2 is, in the exemplary embodiment, a three-phase system with network transformers having delta connected primary windings and wye connected secondary windings, although FIG. 1 shows only single lines for clarity. Spot network 2 is fed by two separate sources in the form of separate substations 4A and 4B. Substation 4A feeds a first medium voltage feeder branch 6A that includes a medium voltage feeder bus 8A having a feeder circuit breaker 10A and high-voltage fuses 11A located at or near the HV terminals of the network transformer. Feeder bus 8A is connected through feeder circuit breaker 10A to the high voltage (HV) terminals of a network transformer 12A, either with or without fuses 11A, with the HV terminals of the transformer connected to the primary windings 14A of network transformer 12A. The low voltage (LV) terminals of network transformer 12A (which are connected to the secondary windings 16A of network transformer 12A) are connected to the transformer side terminals of a network protector 18A. The network terminals of network protector 18A are connected to a common bus 22 through fuses 20 A, referred to as network protector fuses, which may be located either internal or external to the network protector enclosure. Substation 4B feeds a second medium voltage feeder branch 6B that is also coupled to and feeds common bus 22. The second medium voltage feeder branch 6B is similar in structure to feeder branch 6A, and includes a medium voltage feeder bus 8B having a feeder circuit breaker 10B and a high voltage fuse 11B at or near the HV terminals of network transformer 12B having primary windings 14B and secondary windings 16B, a network protector 18B, and fuses 20B. A number of loads 24 are supplied from the common bus 22.

Figure 2:
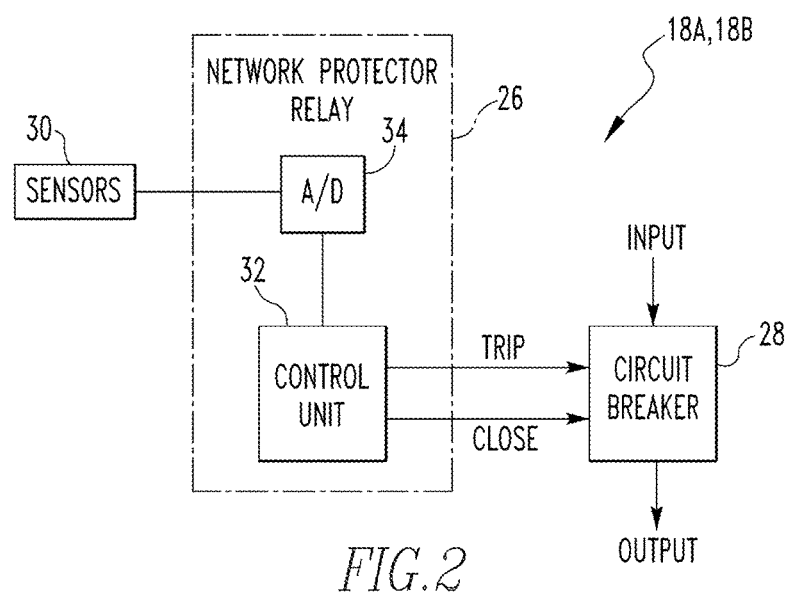
FIG. 2 is a schematic diagram of a network protector according to an exemplary embodiment of the disclosed concept.

FIG. 2 is a schematic diagram of network protector 18A, 18B according to an exemplary embodiment of the disclosed concept. Each network protector 18A, 18B includes a network protector relay 26 that controls circuit breaker 28. Network protector relay 26 includes a control unit 32 that monitors the network transformer phase-to-neutral voltages (e.g., measured at the LV terminals of network transformers 12A and 12B), the network side phase-to-neutral voltages (e.g., measured at the network-side terminals of network transformers 12A and 12B), and the phase currents of network protector 18A of spot network 2 using a number of suitable voltage and current sensors 30. The analog values measured by sensors 30 are provided to control unit 32 through an analog-to-digital converter 34. Control unit 32 is structured to provide trip and close signals to circuit breaker 28 to control the operation (i.e., opening and closing) thereof. As shown in FIG. 1, circuit breaker 28 in FIG. 2 includes an input that is coupled to secondary windings 16A, 16B of the associated network transformer 12A, 12B, and an output that is connected to common bus 22.

In the exemplary embodiment, control unit 32 comprises a processor portion and a memory portion, and may be, for example and without limitation, a microcontroller or a microprocessor or other suitable processing device that interfaces with a suitable memory device. The memory portion can be any one or more of a variety of types of internal and/or external storage media such as, without limitation, RAM, ROM, EPROM(s), EEPROM(s), FLASH, and the like that provide a storage register, i.e., a non-transitory machine readable medium, for data storage such as in the fashion of an internal storage area of a computer, and can be volatile memory or nonvolatile memory. The memory portion of control unit 32 has stored therein a number of routines that are executable by the processor portion of control unit 32 to enable operation and control of network protector 18 as described herein.

In a first aspect of the disclosed concept, each network protector 18A, 18B is configured to permit successful operation of spot network 2 (i.e., without undesirable tripping or pumping of network protectors 18A, 18B) when: (i) the angular difference (±) between the transformer phase-to-neutral voltage of the feeder branch 6A and the transformer phase-to-neutral voltage of the feeder branch 6B of FIG. 1 is less than or equal to a first threshold value, and (ii) the magnitude difference (±) between the transformer phase-to-neutral voltage of the feeder branch 6A and the transformer phase-to-neutral voltage of the feeder branch 6B is less than or equal to a second threshold value. More specifically, this is accomplished by configuring control unit 32 of each network protector relay 26 of each network protector 18A, 18B to have network protector relay non-sensitive trip settings that will allow network protector 18A, 18B to remain closed for angular differences up to the first threshold value and magnitude differences up to the second threshold value. In one exemplary, non-limiting embodiment, the first threshold value is ±4 degrees and the second threshold value is ±3% (a 3% magnitude difference corresponds to 3.75 V voltage difference on a 125 V base), although it will be appreciated that other threshold values are contemplated within the scope of the disclosed concept.

Furthermore, during operation of spot network 2, one of network protectors 18A and 18B could be open, either because it was opened manually, or because the primary feeder (substation 4A or 4B) was taken out of service and subsequently re-energized. In such a situation, it is desired that the open network protector 18A, 18B automatically reclose when the angular and magnitude differences of the transformer phase-to-neutral voltages are within the first and second threshold values (e.g., ±4 degrees and ±3%). According to a further aspect of the disclosed concept, this is accomplished by configuring each network protector 18A, 18B to have network protector relay close settings and characteristics wherein network protector 18A, 18B will automatically reclose when, in the associated feeder branch 6A, 6B: (i) the transformer phase-to-neutral voltage lags the network phase-to-neutral voltage by no more than a third threshold value, and (ii) the magnitude of the transformer phase-to-neutral voltage is lower than the magnitude of the network phase-to-neutral voltage by no more than a fourth threshold value.

One particular non-limiting exemplary implementation of the disclosed concept will now be described in connection with a particular exemplary network protector relay 26, the model MPCV Network Protector Relay commercially available from the assignee hereof. FIG. 3 shows the sensitive trip characteristics (gull-wing) and non-sensitive trip characteristics for the exemplary MPCV Network Protector Relay. The sensitive trip setting, shown as $RT_{SENS}$ in FIG. 3, is adjustable between 0.05% and 5% of protector CT rating. The non-sensitive trip characteristic, shown as $RT_{NON\ SENS}$, can be set as high as 250% of CT rating. As discussed herein, a non-sensitive trip setting can be made in the exemplary MPCV Network Protector Relay that will allow network protectors 18A and 18B in spot network 2 to remain closed for angular differences of up to ±4 degrees and magnitude differences up to ±3%.

Figure 4B:
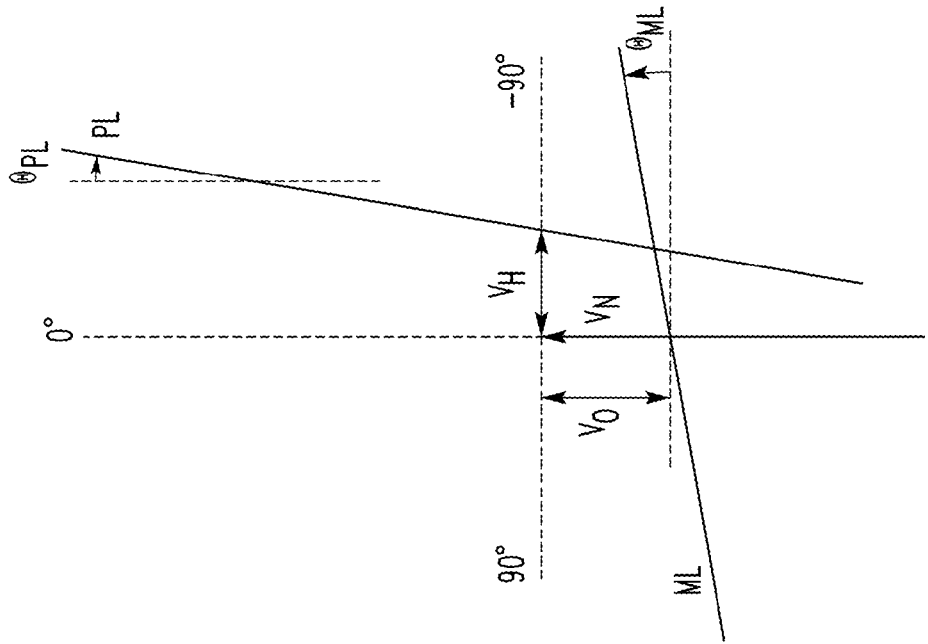
FIGS. 4(a) and 4(b) show respectively normal and revised network protector relay close settings and characteristics for a relay.
Figure 4A:
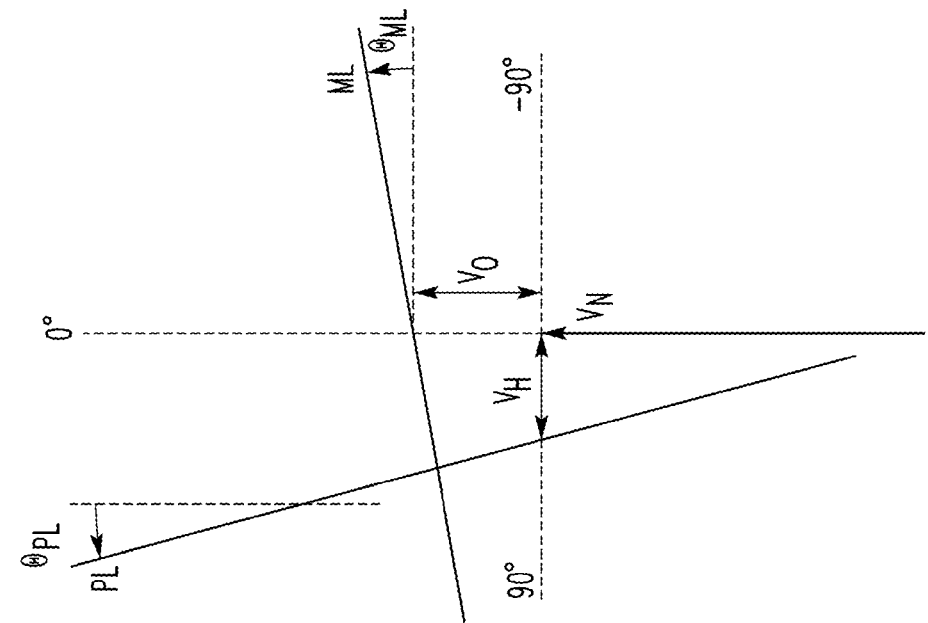

Table 1 below lists the trip settings that will allow both network protectors 18A and 18B to stay closed for feeder voltage angular differences up to ±4 degrees, and feeder voltage magnitude differences up to ±3% when the exemplary MPCV Network Protector Relay is utilized in spot network 2. It is emphasized that the parameters below apply to network protectors in two unit spot networks operating at 480 volts with either 5% or 7% impedance network transformers. The associated protectors have the CT ratings indicated in the table. Further, the operation will be acceptable for load power factors between 80% and 95%.

as the network protector relay 26, FIGS. 4(a) and 4(b) show the revised network protector relay close settings and characteristics for the MPCV Network Protector Relay that will allow operation of spot network 2 from sources with widely differing magnitudes and angles as can occur when the HV primary feeders come from different substations, or from substations with open bus/tie breakers. It consists of two straight lines, the master line (ML) and the phasing line (PL). In order for network protector relay 26 to initiate protector closing, the phasing voltage must lie above the ML and to the left of the phasing line (PL), as is the situation with known electro-mechanical network relays. FIG. 4(a) shows that two settings can be made for the ML, and two settings can be made for the PL. When the ML is above the origin, as in FIG. 4(a), the close setting $V_0$ is positive, and when it is below the origin, as in FIG. 4(b), the close setting $V_0$ is negative. For either case, the slope of the ML, $\theta_{ML}$, is measured as shown from a line perpendicular to the network line-to-ground voltage. When the PL is to the left of the origin as in FIG. 4(a), its offset, $V_H$, is positive, and when the PL is to the right of the origin as in FIG. 4(b), its offset, $V_H$, is negative. The slope of the PL, defined by angle $\theta_{PL}$, can be either positive as in FIG. 4(a), or negative as in FIG. 4(b). For a spot network 2 having 5% impedance network transformers 12A, 12B, exemplary recommended network protector relay close settings and characteristics, consistent with the non-sensitive trip settings of Table 1, are given in Table 2 below.

TABLE 2

Close Settings For Protectors on 5% Impedance Network Transformers

| Quan-tity | Recommended Setting | | Setting Range | |
|---|---|---|---|---|
| | 480-V Base | 125-V Base | 480-V Base | 125-V Base |
| $V_0$ | −7.5 Volt | −3.38 | 11.0 V to −11.0 V | 5.00 V to −5.00 V |
| $\Theta_{ML}$ | 0.0 degree | 0.0 degree | −10 to +10 degree | |
| $V_H$ | −16 Volt | −7.22 Volt | +9 V to −20 V | 4.00 V to −9.00 V |
| $\Theta_{PL}$ | −25 degree | −25 degree | +5 to −35 degree | |

It is emphasized that with the close characteristics in FIGS. 4(a) and (b) and the recommended close settings given in Table 2, network protector pumping would be highly likely if the exemplary MPCV Network Protector Relay did not have the non-sensitive trip settings given in Table 1. For a spot network 2 having 7% impedance network transformers 12A, 12B, exemplary recommended network protector relay

TABLE 1

Trip Settings to Accommodate Voltage Angular Differences of 4.0 Degrees and Voltage Magnitude Differences of 3%

| Voltage | KVA | Z (%) | $I_{FULL\ LOAD}$ (Amps) | CT | $CT/I_{FL}$ | Sensitive (% of CT) | Non Sensitive (% of CT) |
|---|---|---|---|---|---|---|---|
| 480 | 1000 | 5 | 1202 | 1600 | 1.333 | 0.15 | 55 |
| 480 | 1500 | 7 | 1804 | 2500 | 1.386 | 0.15 | 38 |
| 480 | 2000 | 7 | 2405 | 3000 | 1.247 | 0.15 | 42 |
| 480 | 2500 | 7 | 3007 | 3500 | 1.164 | 0.15 | 45 |

Continuing with the description of this exemplary implementation employing the MPCV Network Protector Relay close settings and characteristics, consistent with the non-sensitive trip settings of Table 1, are given in Table 3 below.

TABLE 3

Close Settings For Protectors on 7% Impedance Network Transformers

| Quan- | Recommended Setting | | Setting Range | |
|---|---|---|---|---|
| tity | 480-V Base | 125-V Base | 480-V Base | 125-V Base |
| $V_0$ | −6.0 Volt | −2.708 | 11.0 V to −11.0 V | 5.00 V to −5.00 V |
| $\Theta_{ML}$ | 0.0 degree | 0.0 degree | −10 to +10 degree | |
| $V_H$ | −16 Volt | −7.22 Volt | +9 V to −20 V | 4.00 V to −9.00 V |
| $\Theta_{PL}$ | −25 degree | −25 degree | +5 to −35 degree | |

One concern that arises when network protector relays 26 are provided with the modified settings as described herein is that it may affect the ability of each network protector relay 26 to detect backfeed due to a single line-to-ground (SLG) fault on the associated feeder branch 6A, 6B between the associated feeder circuit breaker 10A, 10B and the associated high voltage fuse 11A, 11B when the associated feeder circuit breaker 10A, 10B is open. This is a concern because the backfeed current in such a situation frequently will be below the non-sensitive trip settings of the network protector relay 26 described herein (see, for example, the settings of Table 1 above, which, as described herein, allow for operation of spot network 2 from primary feeders having widely differing voltages, both in magnitude and angle). As a result, the associated feeder branch 6A, 6B would remain alive on backfeed, which is an undesirable condition. Thus, according to a further aspect of the disclosed concept, a scheme is provided for detecting an SLG fault under these conditions during backfeed from said spot network with network transformers 6A and 6B having a delta connected HV winding.

Figure 5:
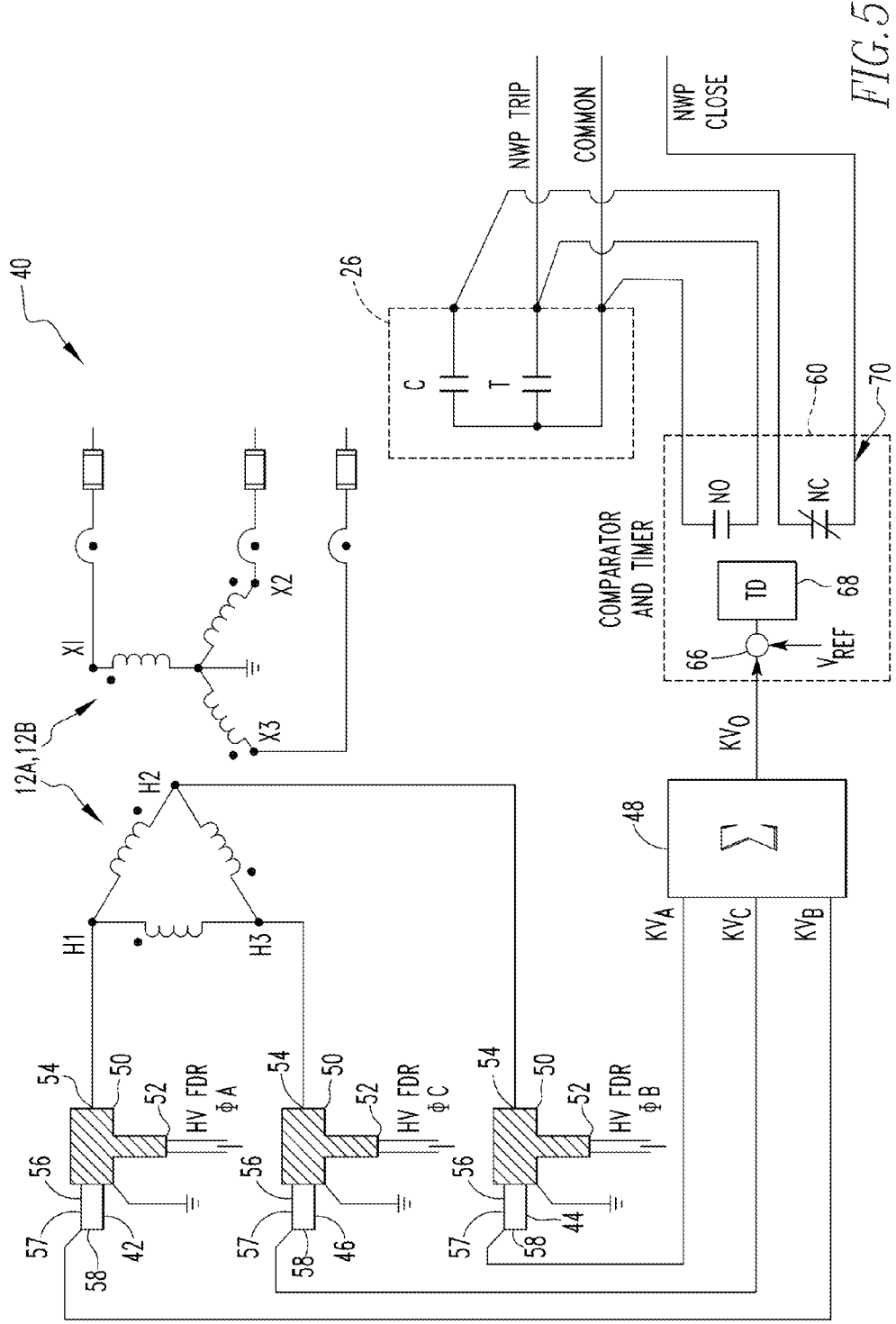
FIG. 5 shows a circuit and scheme for detecting backfeed from a network transformer with a delta connected HV winding due to a SLG fault when the feeder breaker is open according to an aspect of an embodiment of the disclosed concept.

In the non-limiting exemplary embodiment, the scheme of this aspect of the disclosed concept employs the example circuit 40 shown in FIG. 5. The example circuit 40 employs three resistance voltage dividers 42, 44, 46, or any other type voltage divider, as measurement devices for outputting representative phase-to-ground voltages $KV_A$, $KV_B$, $KV_C$ and a summation circuit 48 that outputs a resultant zero-sequence voltage $KV_0$ (K is the ratio of the resistance voltage divider and $V_0$ is the actual primary feeder zero-sequence voltage). The resistance voltage dividers 42, 44, 46, or any other type divider may be, for example and without limitation, voltage dividers marketed by Lindsey Manufacturing Co. of Azusa, Calif. Each of the resistance voltage dividers 42, 44, 46 is coupled to, for example and without limitation, an elbow connector 50. The resistance voltage dividers 42, 44, 46, the summation circuit 48 and a comparator/timer 60 are located at or about the network transformer 12A, 12B. Although example elbow connectors 50 are shown, other suitable types of transformer bushing connectors and cable connectors can be employed with the same or different voltage measurement circuits. The example elbow connector 50 has a first terminal 52 for a corresponding connection to one of the three phase voltages, a second terminal 54 for a corresponding connection to one terminal of the network transformer, either terminal H1, H2, H3, of the delta winding of the network transformer 12A, 12B, and a third terminal 56 for the input 57 of the corresponding one of the resistance voltage dividers 42, 44, 46. For example, each of the resistance voltage dividers 42, 44, 46 includes two resistors (not shown) in series, a smaller resistor (Rs) and a larger resistor (Rl), electrically connected from phase (at terminal 52 and input 57) to ground G with resistor Rs between ground G and a voltage measuring tap 58, and resistor Rl between the output of voltage measuring tap 58 and the phase voltage (at terminal 52 and input 57). The two resistors Rl, Rs then split the line-to-ground voltage according to the Rs/(Rs+Rl) ratio K such that the voltage (Vm) between the voltage measuring tap 58 and ground G is equal to the system line-to-ground voltage (e.g., without limitation, 13.2 kV) times the Rs/(Rs+Rl) ratio K, thereby providing a sensed voltage $KV_A$, $KV_B$, $KV_C$ having a suitably low and safe value. The comparator/timer 60 monitors measured voltage $KV_0$ against a suitable threshold $V_{REF}$ to provide a control output as described when a shift beyond the threshold $V_{REF}$ is detected for a suitable time delay TD.

Thus, in the scheme of FIG. 5, the three phase-to-ground voltages of the primary feeder at the HV terminals of the network transformer 12A, 12B are summed to give a signal, $KV_0$, that is proportional to the zero-sequence component of the primary feeder line-to-ground voltages, $V_0$. In absence of a fault and with the feeder circuit breaker 10A, 10B closed, the zero-sequence voltage on the feeder branch 6A, 6B would not be expected to exceed 0.01 or 0.02 per unit. In contrast, in the case of a SLG fault on the feeder branch 6A, 6B and with the feeder circuit breaker 10A, 10B open, the zero-sequence voltage on the feeder branch 6A, 6B would be approximately 1.0 per unit. Thus, the difference in zero-sequence voltage magnitude on the feeder branch 6A, 6B between faulted and unfaulted conditions is substantial, allowing positive detection of the SLG fault with the feeder circuit breaker 10A, 10B open based on that value.

Accordingly, in this aspect of the disclosed concept, if the zero-sequence voltage from summation circuit 48, $KV_0$, is above a predetermined threshold, shown as $V_{REF}$ in FIG. 5, and persists above that threshold for time greater than TD, the NO contacts of relay 70 would make, and the NC contacts would open. These contacts would maintain these positions as long as $KV_0$ is above the threshold. In response, the associated network protector 18A, 18B would trip, and the closing circuit of the associated network protector 18A, 18B would open, preventing re-closure through the relay close logic. As a result, the scheme as just described provides a mechanism (based on zero-sequence voltage magnitude) wherein network protector relays 26 that are provided with the modified settings as described herein are able to detect backfeed due to a single line-to-ground (SLG) fault on the associated feeder branch 6A, 6B between the associated feeder circuit breaker 10A, 10B and the associated high voltage fuse 11A, 11B when the associated feeder circuit breaker 10A, 10B is open.

The scheme in FIG. 5 would not detect an open feeder circuit breaker 10A, 10B in the absence of a fault, and as a result network protectors 18A, 18B with the non-sensitive trip settings as described herein (e.g., see Table 1) may not trip. With the feeder circuit breaker 10A, 10B opened in absence of a fault, the zero-sequence voltage on the feeder branch 6A, 6B is determined by the balance of the phase-to-ground capacitances, which should be quite good. These capacitances are due mainly to the capacitances of the primary feeder shielded cables, and from the capacitance to ground of the HV windings of the network transformers 12A, 12B. It is doubtful that the zero-sequence voltage would exceed the threshold level selected to detect the SLG fault.

U.S. Patent Application Publication No. 2015/0124358, owned by the assignee hereof and incorporated by reference herein, describes a solution for detecting an open feeder breaker in absence of a fault. It is applicable when all transformers, network or otherwise, on the feeder have the delta connected HV windings (see FIG. 1 of 2015/0124358). The solution consists of connecting one or more power factor correction capacitors from one phase to ground at or near the substation, which unbalances the phase-to-ground voltages when the breaker is opened in absence of a fault. The capacitance, which must be connected to one phase to generate a zero-sequence voltage that is above the threshold detection level, can be easily found if the phase-to-ground capacitance (from cables and transformers) for each phase is known. This solution in conjunction with the control scheme shown in FIG. 5 may, according to a further aspect of the disclosed concept, be used to enable network protectors 18A, 18B having the non-sensitive trip settings as described herein to detect an open feeder circuit breaker 10A, 10B in absence of a fault.

Thus, the disclosed concept provides a methodology for enabling successful operation of a two-unit spot network 2 that is supplied from sources (substations 4A and 4B) having considerable differences in the magnitude and/or angle of the voltage that is applied to the high voltage terminals of the network transformers 12 and 12B. As described herein, the methodology allows both network protectors 18A, 18B of spot network 2 to remain closed when the angular and magnitude differences between the two feeders are within respective first and second thresholds. At the same time, the methodology enables each network protector 18A, 18B to automatically reclose and remain closed when the system is within the limits just described. Further, the methodology provides a scheme for detecting backfeed due to an SLG fault when a feeder breaker is open, and a scheme for detecting an open feeder breaker in the absence of a fault.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A network protector for a spot network having a first feeder branch and a second feeder branch, comprising:
   a circuit breaker; and
   a network protector relay coupled to the circuit breaker, wherein the network protector relay is structured and configured to have network protector relay non-sensitive trip settings for controlling operation of the circuit breaker that will cause the network protector to remain closed when: (i) an angular difference (±) between a transformer phase-to-neutral voltage of the first feeder branch and a transformer phase-to-neutral voltage of the second feeder branch is less than or equal to a first threshold value, and (ii) a magnitude difference (±) between the transformer phase-to-neutral voltage of the first feeder branch and the transformer phase-to-neutral voltage of the second feeder branch is less than or equal to a second threshold value.

2. The network protector according to claim 1, wherein the first threshold value is ±4 degrees and the second threshold value is ±3%.

3. The network protector according to claim 1, wherein the network protector relay is structured and configured to have network protector relay close settings and characteristics that will cause the network protector to automatically reclose when: (i) the transformer phase-to-neutral voltage of the first feeder branch lags a network phase-to-neutral voltage of the first feeder branch by no more than a third threshold value, and (ii) a magnitude of the transformer phase-to-neutral voltage of the first feeder branch is lower than a magnitude of the network phase-to-neutral voltage of the first feeder branch by no more than a fourth threshold value.

4. The network protector according to claim 1, wherein the network protector relay is structured and configured to detect backfeed due to a single line-to-ground (SLG) fault on the first feeder branch when a feeder circuit breaker in the first feeder branch is open based on a zero-sequence voltage of the first feeder branch.

5. The network protector according to claim 4, wherein the zero-sequence voltage of the first feeder branch is determined using a circuit that is part of or separate from the network protector relay.

6. The network protector according to claim 4, wherein the network protector relay is structured and configured to detect backfeed due to a single line-to-ground (SLG) fault on the first feeder branch when a feeder circuit breaker in the first feeder branch is open based on determining that a parameter proportional to the zero-sequence voltage of the first feeder branch exceeds a predetermined threshold for a predetermined amount of time.

7. The network protector according to claim 4, wherein the network protector relay is structured and configured to detect that the feeder circuit breaker in the first feeder branch is open in the absence of a fault based on a capacitance of one or more power factor correction capacitors connected from one phase of the first feeder branch to ground.

8. A method of controlling a network protector for a spot network having a first feeder branch and a second feeder branch, the network protector including a circuit breaker and a network protector relay coupled to the circuit breaker, the method comprising:
   controlling operation of the circuit breaker from the network protector relay based on network protector relay non-sensitive trip settings, wherein the controlling includes causing the network protector to remain closed when: (i) an angular difference (±) between a transformer phase-to-neutral voltage of the first feeder branch and a transformer phase-to-neutral voltage of the second feeder branch is less than or equal to a first threshold value, and (ii) a magnitude difference (±) between the transformer phase-to-neutral voltage of the first feeder branch and the transformer phase-to-neutral voltage of the second feeder branch is less than or equal to a second threshold value.

9. The method according to claim 8, wherein the first threshold value is ±4 degrees and the second threshold value is ±3%.

10. The method according to claim 8, further comprising controlling operation of the circuit breaker from the network protector relay based on network protector relay close settings and characteristics by causing the network protector to automatically reclose when: (i) the transformer phase-to-neutral voltage of the first feeder branch lags a network phase-to-neutral voltage of the first feeder branch by no more than a third threshold value, and (ii) a magnitude of the transformer phase-to-neutral voltage of the first feeder branch is lower than a magnitude of the network phase-to-neutral voltage of the first feeder branch by no more than a fourth threshold value.

11. The method according to claim 8, further comprising detecting backfeed due to a single line-to-ground (SLG) fault on the first feeder branch when a feeder circuit breaker in the first feeder branch is open based on a zero-sequence voltage of the first feeder branch.

12. The method according to claim 11, further comprising determining the zero-sequence voltage.

13. The method according to claim 11, wherein the detecting backfeed comprises determining that a parameter proportional to the zero-sequence voltage of the first feeder branch exceeds a predetermined threshold for a predetermined amount of time.

14. The method according to claim 11, further comprising detecting that the feeder circuit breaker in the first feeder branch is open in the absence of a fault based on a capacitance of one or more power factor correction capacitors connected from one phase of the first feeder branch to ground.

15. A network protector relay including a non-transitory computer readable medium encoded with a computer program comprising program code for implementing the method of claim 8.

* * * * *